United States Patent
Hwang et al.

(10) Patent No.: US 10,210,806 B2
(45) Date of Patent: Feb. 19, 2019

(54) DATA DRIVE CIRCUIT OF AMOLED DISPLAY DEVICE

(71) Applicant: Shenzhen China Star Optoelectronics Technology Co., Ltd., Shenzhen (CN)

(72) Inventors: Taijiun Hwang, Shenzhen (CN); Jihshiang Lee, Shenzhen (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 269 days.

(21) Appl. No.: 15/120,747

(22) PCT Filed: Jun. 27, 2016

(86) PCT No.: PCT/CN2016/087325
§ 371 (c)(1),
(2) Date: Aug. 23, 2016

(87) PCT Pub. No.: WO2017/215029
PCT Pub. Date: Dec. 21, 2017

(65) Prior Publication Data
US 2018/0204515 A1    Jul. 19, 2018

(30) Foreign Application Priority Data
Jun. 12, 2016 (CN) .......................... 2016 1 0414172

(51) Int. Cl.
*G09G 3/3258* (2016.01)
*G09G 3/3291* (2016.01)
*H01L 27/32* (2006.01)

(52) U.S. Cl.
CPC ......... *G09G 3/3258* (2013.01); *G09G 3/3291* (2013.01); *H01L 27/3262* (2013.01); *G09G 2310/0264* (2013.01)

(58) Field of Classification Search
CPC ......... G09G 2300/0452; G09G 3/3258; G09G 2310/027; G09G 3/3291; G09G 3/3233;
(Continued)

(56) References Cited

U.S. PATENT DOCUMENTS

2007/0236422 A1* 10/2007 Park ..................... G09G 3/3233
                                                                345/76
2012/0306947 A1* 12/2012 Kim ..................... G09G 3/3233
                                                                345/694
(Continued)

FOREIGN PATENT DOCUMENTS

CN          102810293 A       12/2012

*Primary Examiner* — Koosha Sharifi-Tafreshi
(74) *Attorney, Agent, or Firm* — Leong C. Lei

(57) ABSTRACT

The present invention provides a data drive circuit of an AMOLED display device, comprising the digital to analog conversion unit (1) capable of receiving four sets of independent gamma reference voltages, and the input output buffer unit (2) electrically coupled to the digital to analog conversion unit (1). The digital to analog conversion unit (1) outputs four sets of data signals to the input output buffer unit (2) according to the received four sets of independent gamma reference voltages. The input output buffer unit (2) determines the output control signal received by the input output buffer unit (2) according to the type of the connected display panel, and thus to control the input output buffer unit (2) to output all the four sets of data signal voltages or three sets in the four sets of data signal voltages.

13 Claims, 3 Drawing Sheets

(58) Field of Classification Search
CPC ... G09G 2310/0286; G09G 2310/0289; G09G 2310/0275; G09G 2310/0294; G09G 3/3275; H01L 27/3213
See application file for complete search history.

(56) References Cited

U.S. PATENT DOCUMENTS

2014/0176400 A1\* 6/2014 Park .................. G09G 3/3233
345/76
2015/0062192 A1\* 3/2015 Kim .................. G09G 3/3291
345/690

\* cited by examiner

DATA DRIVE CIRCUIT OF AMOLED DISPLAY DEVICE

FIELD OF THE INVENTION

The present invention relates to a display technology field, and more particularly to a data drive circuit of an AMOLED display device.

BACKGROUND OF THE INVENTION

The Organic Light Emitting Display (OLED) possesses many outstanding properties of self-illumination, low driving voltage, high luminescence efficiency, short response time, high clarity and contrast, near 180° view angle, wide range of working temperature, applicability of flexible display and large scale full color display. The OLED is considered as the most potential display device.

The OLED can be categorized into two major types according to the driving methods, which are the Passive Matrix OLED (PMOLED) and the Active Matrix OLED (AMOLED), i.e. two types of the direct addressing and the Thin Film Transistor (TFT) matrix addressing. The AMOLED comprises pixels arranged in array and belongs to active display type, which has high lighting efficiency and is generally utilized for the large scale display devices of high resolution.

With the development of the display technology, the requirements of the people to the display qualities of the display device, such as the display brightness, the color reduction, the richness of the image color gets higher and higher. The display merely utilizing the red, green and blue, three primary colors can no longer satisfy the requirements of the people to the display device. Thereafter, the four colors display device having red, green, blue, white four colors is proposed. One white sub pixel is added in each pixel for forming the RGBW pixel structure constructed by the red sub pixel R, the green sub pixel G, the blue sub pixel B and the white sub pixel W. In the same display image, the display device utilizing the RGBW pixel structure has the display brightness, the color reduction and richer image colors with higher quality than the display device utilizing the RGB pixel structure, and is pursued by the consumers.

However, the data driving circuit of the AMOLED display device according to prior art generally comprises only three sets of independent gamma voltages, i.e. the red, the green and the blue gamma voltages. Because the output of the data driving circuit is fixed for corresponding the circular permutation of the red, green, blue sub pixels, and as being applied in the RGBW four colors display device, it will cause the corresponding error of the blue gamma voltage. Therefore, it is required to independently process the white gamma voltage corresponding to the white sub pixel. As shown in FIG. 1, the white sub pixels are all coupled to the second data driving circuit 202 above the display panel 100 for process, and the first data driving circuit 201 under the display panel 100 still processes the red, the green and the blue sub pixels. However, the additional data driving circuit will increase the cost, and meanwhile, the data driving circuit of the AMOLED display device according to prior art generally is one way output, and cannot receives the compensation signal transmitted from the side of the display panel 100, and the function is solo.

SUMMARY OF THE INVENTION

An objective of the present invention is to provide a data drive circuit of an AMOLED display device, which can switch between outputting four sets of data signal voltages and three sets of data signal voltages, and meanwhile, can receive the sensing voltage signal provided by the display panel to achieve the bidirectional transmission of data to decrease the amount of the data drive IC and reduce the production cost.

For realizing the aforesaid objective, the present invention provides a data drive circuit of an AMOLED display device, comprising: a digital to analog conversion unit, an input output buffer unit electrically coupled to the digital to analog conversion unit, and a display panel electrically coupled to the input output buffer unit; wherein the digital to analog conversion unit receives four sets of gamma reference voltages, and outputs four sets of corresponding data signal voltages to the input output buffer unit according to the four sets of gamma reference voltages;

the input output buffer unit receives an output control signal, and the input output buffer unit is controlled to output all of the four sets of data signal voltages or three sets in the four sets of data signal voltages, which are provided by the digital to analog conversion unit, to the display panel according to the output control signal.

the data drive circuit of the AMOLED display device further comprises: a level shift unit electrically coupled to the digital to analog conversion unit, a latch unit electrically coupled to the level shift unit, a shift register unit electrically coupled to the latch unit, a data receiving unit electrically coupled to the latch unit, and a sequence control unit electrically coupled to the data receiving unit;

the sequence control unit outputs four display data corresponding to the four sets of the gamma reference voltages to the data receiving unit.

the data drive circuit of the AMOLED display device further comprises: a sensing data process unit electrically to both the input output buffer unit and the sequence control unit;

the input output buffer unit further receives a sensing voltage signal outputted from the display panel, and transmits the same to the sequence control unit through the sensing data process unit, and the sequence control unit adjusts outputted four display data according to the sensing voltage signal to perform brightness compensation to the display panel.

The input output buffer unit comprises a plurality of input output terminals, and the display panel comprises sub pixel driving circuits aligned in array;

each input output terminal is electrically coupled to the sub pixel driving circuits of one column, correspondingly.

Each sub pixel driving circuit comprises: a first thin film transistor, a second thin film transistor, a third thin film transistor and an organic light emitting diode;

a gate of the first thin film transistor receives a scan pulse signal, and a source is electrically coupled to the input output terminal corresponded with the sub pixel driving circuit, and a drain is electrically coupled to a gate of the second thin film transistor;

a source of the second thin film transistor is electrically coupled to a direct current high voltage, and a drain is electrically coupled to an anode of the organic light emitting diode;

a gate of the third thin film transistor receives a sensing pulse signal, and a source is electrically coupled to the input output terminal corresponded with the sub pixel driving circuit, and a drain is electrically coupled to a cathode of the organic light emitting diode;

the cathode of the organic light emitting diode is electrically coupled to a direct current low voltage.

the four sets of gamma reference voltages are a red gamma reference voltage, a green gamma reference voltage, a blue gamma reference voltage and a white gamma reference voltage, respectively;

the four sets of data signal voltages are a red data signal voltage, a green data signal voltage, a blue data signal voltage and a white data signal voltage, respectively;

the four display data are red display data, green display data, blue display data and white display data;

the display panel is a four colors display panel, comprising red, green, blue and white, four sub pixels, and the output control signal controls the input output buffer unit to output the red data signal voltage, the green data signal voltage, the blue data signal voltage and the white data signal voltage to the corresponding red, green, blue and white sub pixels.

The display panel is a three colors display panel, comprising red, green and blue, three sub pixels, and the output control signal controls the input output buffer unit to output the red data signal voltage, the green data signal voltage and the blue data signal voltage to the corresponding red, green and blue sub pixels.

The present invention further provides a data drive circuit of an AMOLED display device, comprising: a digital to analog conversion unit, an input output buffer unit electrically coupled to the digital to analog conversion unit, and a display panel electrically coupled to the input output buffer unit; wherein the digital to analog conversion unit receives four sets of gamma reference voltages, and outputs four sets of corresponding data signal voltages to the input output buffer unit according to the four sets of gamma reference voltages;

the input output buffer unit receives an output control signal, and the input output buffer unit is controlled to output all of the four sets of data signal voltages or three sets in the four sets of data signal voltages, which are provided by the digital to analog conversion unit, to the display panel according to the output control signal;

the data drive circuit of the AMOLED display device further comprises: a level shift unit electrically coupled to the digital to analog conversion unit, a latch unit electrically coupled to the level shift unit, a shift register unit electrically coupled to the latch unit, a data receiving unit electrically coupled to the latch unit, and a sequence control unit electrically coupled to the data receiving unit;

the sequence control unit outputs four display data corresponding to the four sets of the gamma reference voltages to the data receiving unit;

the data drive circuit of the AMOLED display device further comprises: a sensing data process unit electrically to both the input output buffer unit and the sequence control unit;

the input output buffer unit further receives a sensing voltage signal outputted from the display panel, and transmits the same to the sequence control unit through the sensing data process unit, and the sequence control unit adjusts outputted four display data according to the sensing voltage signal to perform brightness compensation to the display panel;

the four sets of gamma reference voltages are a red gamma reference voltage, a green gamma reference voltage, a blue gamma reference voltage and a white gamma reference voltage, respectively;

the four sets of data signal voltages are a red data signal voltage, a green data signal voltage, a blue data signal voltage and a white data signal voltage, respectively;

the four display data are red display data, green display data, blue display data and white display data.

The benefits of the present invention are: the data drive circuit of the AMOLED display device provided by the present invention comprises the digital to analog conversion unit capable of receiving four sets of independent gamma reference voltages, and the input output buffer unit electrically coupled to the digital to analog conversion unit. The digital to analog conversion unit outputs four sets of data signals to the input output buffer unit according to the received four sets of independent gamma reference voltages. The input output buffer unit determines the output control signal received by the input output buffer unit according to the type of the connected display panel, and thus to control the input output buffer unit to output all the four sets of data signal voltages or three sets in the four sets of data signal voltages. In comparison with prior art, it does not require adding the additional data drive IC as outputting the four sets of data signal voltages, and the production cost is lower. Meanwhile, the input output buffer unit does not merely have output function but also have input function, which can receive the sensing voltage signal from the inside of the display panel, and perform brightness compensation to the display panel to the display panel according to the sensing voltage signal, and the integration level is high.

BRIEF DESCRIPTION OF THE DRAWINGS

In order to better understand the characteristics and technical aspect of the invention, please refer to the following detailed description of the present invention is concerned with the diagrams, however, provide reference to the accompanying drawings and description only and is not intended to be limiting of the invention.

In drawings.

DETAILED DESCRIPTION OF PREFERRED EMBODIMENTS

For better explaining the technical solution and the effect of the present invention, the present invention will be further described in detail with the accompanying drawings and the specific embodiments.

Figure 1:
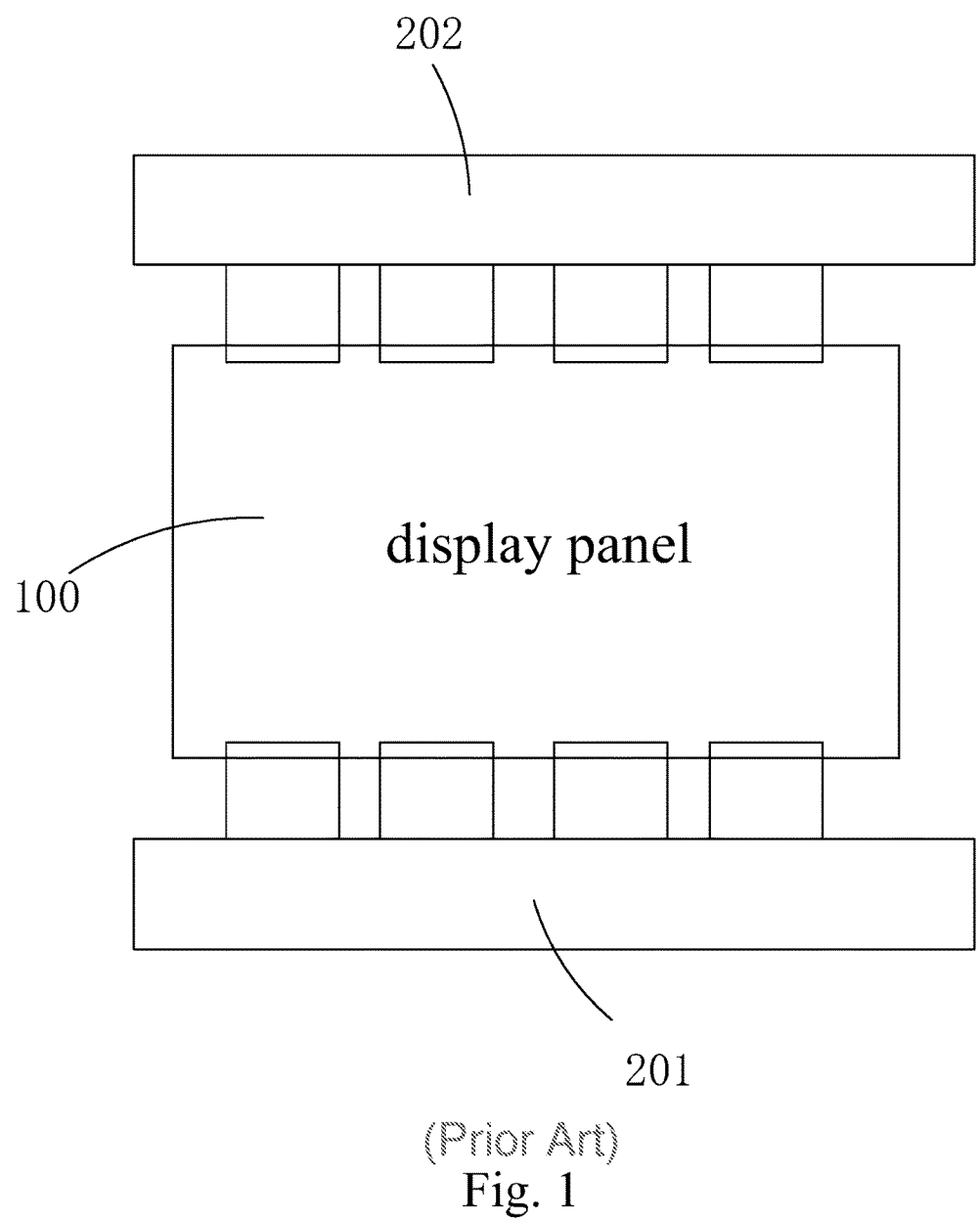
FIG. 1 is a structure diagram of a four colors AMOLED display device according to prior art.
Figure 2:
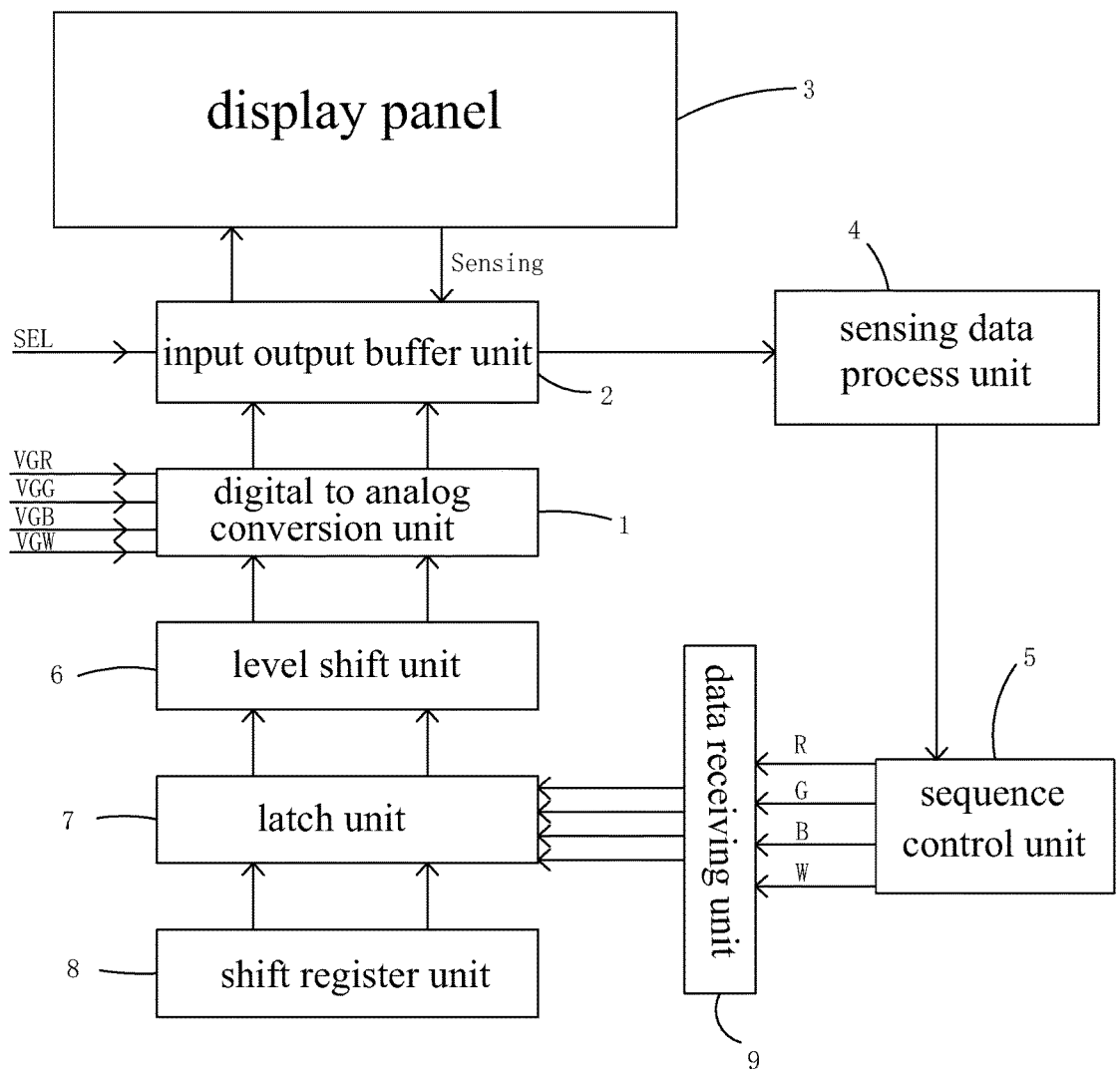
FIG. 2 is a circuit diagram of a data drive circuit of an AMOLED display device according to the present invention.

Please refer to FIG. 2. The present invention provides a data drive circuit of an AMOLED display device, comprising: a digital to analog conversion unit 1, an input output buffer unit 2 electrically coupled to the digital to analog conversion unit 1, and a display panel 3 electrically coupled to the input output buffer unit 2.

Specifically, the digital to analog conversion unit 1 receives four sets of gamma reference voltages, and outputs four sets of corresponding data signal voltages to the input output buffer unit 2 according to the four sets of gamma reference voltages.

Selectably, the four sets of gamma reference voltages received by the digital to analog conversion unit 1 are: a red gamma reference voltage VGR, a green gamma reference voltage VGG, a blue gamma reference voltage VGB and a white gamma reference voltage VGW, respectively, and the four sets of data signal voltages correspondingly outputted according to the four sets of gamma reference voltages are a red data signal voltage, a green data signal voltage, a blue data signal voltage and a white data signal voltage.

Specifically, the input output buffer unit 2 receives an output control signal SEL, and the input output buffer unit 2 is controlled to output all of the four sets of data signal voltages or three sets in the four sets of data signal voltages, which are provided by the digital to analog conversion unit 1, to the display panel according to the output control signal SEL.

Furthermore, the output control signal SEL has two states of 0 and 1, and as the output control signal SEL is in the 0 state, the input output buffer unit 2 outputs three sets in the four sets of data signal voltages to the display panel, and for instance, only the red data signal voltage, the green data signal voltage and the blue data signal voltage are outputted, and the white data signal voltage is not; as the output control signal SEL is in the 1 state, the input output buffer unit 2 outputs the four sets of data signal voltages to the display panel, and for instance, the red data signal voltage, the green data signal voltage, the blue data signal voltage and the white data signal voltage are outputted.

Specifically, the state of the output control signal SEL is determined according to the type of the display 3 connected with the input output buffer unit 2. Selectably, the display panel 3 is a three colors display panel, comprising the red, the green, and the blue sub pixels. Correspondingly, the output control signal SEL is in 0 state, and thus, the input output buffer unit 2 outputs the red data signal voltage, the green data signal voltage and the blue data signal voltage respectively corresponding to the red, the green, and the blue sub pixels to the display panel 3. Selectably, the display panel 3 also can be a four colors display panel, comprising the red, the green, the blue and the white sub pixels. Correspondingly, the output control signal SEL is in 1 state, and thus, the input output buffer unit 2 outputs the red data signal voltage, the green data signal voltage the blue data signal voltage, the white data signal voltage respectively corresponding to the red, the green, the blue and the white sub pixels to the display panel 3. Namely, with the data driving circuit of the AMOLED display device provided by the present invention, the three colors display can be driven, and the four colors display panel also can be driven. Besides, the additional data driving Integrated Circuit (IC) is not required as driving the four colors display panel, and the cost is lower than prior art.

Furthermore, the data driving circuit of the AMOLED display device further comprises: a level shift unit 6 electrically coupled to the digital to analog conversion unit 1, a latch unit 7 electrically coupled to the level shift unit 6, a shift register unit 8 electrically coupled to the latch unit 7, a data receiving unit 9 electrically coupled to the latch unit 7, and a sequence control unit 5 electrically coupled to the data receiving unit 9;

the sequence control unit 5 outputs four display data corresponding to the four sets of the gamma reference voltages to the data receiving unit 9.

Specifically, the four display data are red display data R, green display data G, blue display data B and white display data W.

Particularly, for the display panel 3 with brightness compensation, the data driving circuit of the AMOLED display device can further comprises: a sensing data process unit 4 electrically to both the input output buffer unit 2 and the sequence control unit 5.

The input output buffer unit 2 receives a sensing voltage signal Sensing outputted from the display panel 3, and transmits the same to the sequence control unit 5 after the sensing data process unit 4 processes the same, and the sequence control unit 5 adjusts outputted four display data according to the sensing voltage signal Sensing, and thus to perform brightness compensation to the display panel 3.

Significantly, the input output buffer unit 2 comprises a plurality of input output terminals, and the display panel 3 comprises sub pixel driving circuits aligned in array, and each input output terminal is electrically coupled to the sub pixel driving circuits of one column, correspondingly.

Figure 3:
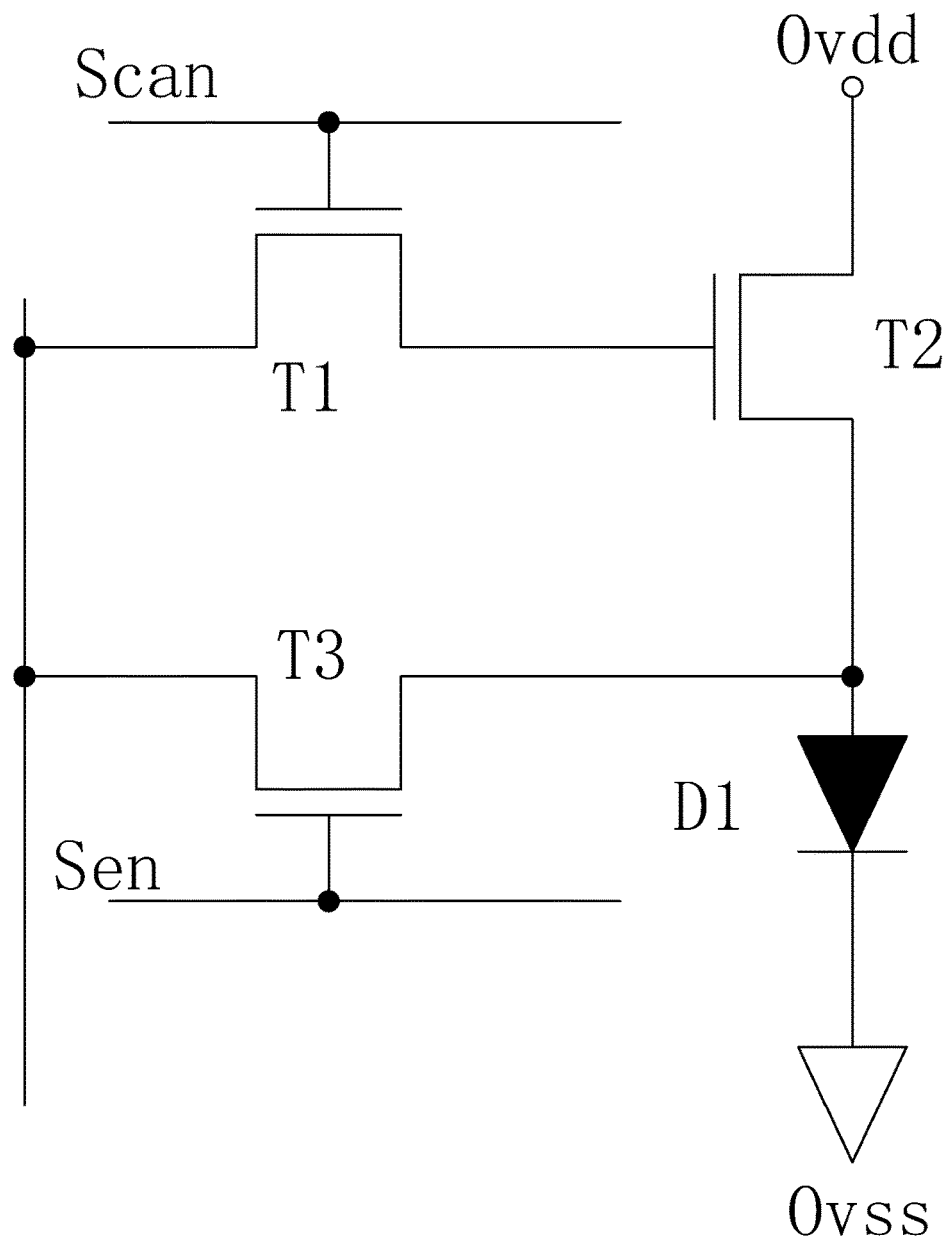
FIG. 3 is a circuit diagram of a sub pixel driving circuit in the display panel of the data drive circuit of the AMOLED display device according to the present invention.

Furthermore, referring to FIG. 3, each sub pixel driving circuit comprises: a first thin film transistor T1, a second thin film transistor T2, a third thin film transistor T3 and an organic light emitting diode D1; a gate of the first thin film transistor T1 receives a scan pulse signal Scan, and a source is electrically coupled to the input output terminal corresponded with the sub pixel driving circuit, and a drain is electrically coupled to a gate of the second thin film transistor T2; a source of the second thin film transistor T2 is electrically coupled to a direct current high voltage Ovdd, and a drain is electrically coupled to an anode of the organic light emitting diode D1; a gate of the third thin film transistor T3 receives a sensing pulse signal Sen, and a source is electrically coupled to the input output terminal corresponded with the sub pixel driving circuit, and a drain is electrically coupled to a cathode of the organic light emitting diode D1; the cathode of the organic light emitting diode D1 is electrically coupled to a direct current low voltage Ovss.

Specifically, the complete working process of the data drive circuit of the AMOLED display device according to the present invention is: first, the sequence control unit 5 provides four display data, the red display data R, the green display data G, the blue display data B and the white display data W to the data receiving unit 9, and the four display data is transmitted to the digital to analog conversion unit 1 through the latch unit 7 and the level shift unit 6, and the digital to analog conversion unit 1 outputs four sets of data signal voltages to the input output buffer unit 2 according to the four display data and the received four sets of gamma reference voltages, and then, the input output buffer unit 2 determines to output three sets or four sets data signal voltages to the sub pixel driving circuit in the display 3 according to the received output control signal SEL, and the sub pixel driving circuit receives the data signal voltage, and meanwhile, the scan pulse signal Scan controls the first thin film transistor T1 to be on, and the data signal voltage control the second thin film transistor T2 to be on, and the organic light emitting diode D1 emits light, and then, the scan pulse signal Scan controls the first thin film transistor T1 to be off, and the sensing pulse signal Sen controls the third thin film transistor T3 to be on, and the source of the third thin film transistor T3 outputs the sensing voltage signal Sensing to the input output buffer unit 2, and the input output buffer unit 2 receives the sensing voltage signal Sensing, and then transmits the same to the sensing data process unit 4 to be processes and then sends the same to the sequence control unit 5, and then the sequence control unit 5 correspondingly adjusts the outputted display data according to the sensing voltage signal Sensing to perform brightness compensation to the display panel 3.

In conclusion, the data drive circuit of the AMOLED display device provided by the present invention comprises the digital to analog conversion unit capable of receiving four sets of independent gamma reference voltages, and the input output buffer unit electrically coupled to the digital to analog conversion unit. The digital to analog conversion unit outputs four sets of data signals to the input output buffer unit according to the received four sets of independent gamma reference voltages. The input output buffer unit determines the output control signal received by the input output buffer unit according to the type of the connected display panel, and thus to control the input output buffer unit to output all the four sets of data signal voltages or three sets in the four sets of data signal voltages. In comparison with prior art, it does not require adding the additional data drive IC as outputting the four sets of data signal voltages, and the production cost is lower. Meanwhile, the input output buffer unit does not merely have output function but also have input function, which can receive the sensing voltage signal from the inside of the display panel, and perform brightness compensation to the display panel to the display panel according to the sensing voltage signal, and the integration level is high.

Above are only specific embodiments of the present invention, the scope of the present invention is not limited to this, and to any persons who are skilled in the art, change or replacement which is easily derived should be covered by the protected scope of the invention. Thus, the protected scope of the invention should go by the subject claims.

What is claimed is:

1. A method of operating a data drive circuit of an AMOLED display device, comprising:
   supplying four sets of display data and supplying four sets of gamma reference voltages;
   generating four sets of data signal voltages corresponding to the four sets of display data, respectively, according to the four sets of gamma reference voltages, and supplying the four sets of data signal voltages to an input output buffer unit to which a display panel is electrically coupled;
   supplying an output control signal exhibiting two different states, including a first state or a second state different from the first state, to the input output buffer unit, such that the input output buffer unit provides all of the four sets of data signal voltages to the display panel in response to the first state of the output control signal and the input output buffer unit provides three sets in the four sets of data signal voltages to the display panel in response to the second state of the output control signal.

2. The method of operating the data drive circuit of the AMOLED display device according to claim 1, wherein the data drive circuit comprises a level shift unit, a latch unit electrically coupled to the level shift unit, a shift register unit electrically coupled to the latch unit, and a data receiving unit electrically coupled to the latch unit;
   wherein the four sets of display data are respectively corresponding to the four sets of gamma reference voltages and are supplied to the data receiving unit to be further transmitted from the data receiving unit toward the display panel.

3. The method of operating the data drive circuit of the AMOLED display device according to claim 2, wherein a sensing data process unit is electrically coupled to the input output buffer unit;
   wherein the input output buffer unit further receives a sensing voltage signal outputted from the display panel, and transmits the sensing voltage signal to the sensing data process unit, such that an operation of adjustment of the four sets of display data is carried out according to the sensing voltage signal to perform brightness compensation to the display panel.

4. The method of operating the data drive circuit of the AMOLED display device according to claim 3, wherein the input output buffer unit comprises a plurality of input output terminals, and the display panel comprises sub pixel driving circuits that are arranged in an array having columns respectively corresponding to the input output terminals of the input output buffer unit;
   wherein each of the input output terminals is electrically coupled to the sub pixel driving circuits of the column of the array corresponding thereto.

5. The method of operating the data drive circuit of the AMOLED display device according to claim 4, wherein each of the sub pixel driving circuits comprises: a first thin film transistor, a second thin film transistor, a third thin film transistor and an organic light emitting diode;
   wherein the first thin film transistor comprises a gate that receives a scan pulse signal, a source that is electrically coupled to the input output terminal corresponding to the column of the array in which the sub pixel driving circuit is arranged, and a drain that is electrically coupled to a gate of the second thin film transistor;
   wherein the second thin film transistor comprises a gate that is electrically coupled to a direct current high voltage and a drain that is electrically coupled to an anode of the organic light emitting diode;
   wherein the third thin film transistor comprises a gate that receives a sensing pulse signal, a source that is electrically coupled to the input output terminal corresponding to the column of the array in which the sub pixel driving circuit is arranged, and a drain that is electrically coupled to a cathode of the organic light emitting diode; and
   the cathode of the organic light emitting diode is electrically coupled to a direct current low voltage.

6. The method of operating the data drive circuit of the AMOLED display device according to claim 2, wherein the four sets of gamma reference voltages are a red gamma reference voltage, a green gamma reference voltage, a blue gamma reference voltage and a white gamma reference voltage, respectively;
   the four sets of data signal voltages are a red data signal voltage, a green data signal voltage, a blue data signal voltage and a white data signal voltage, respectively; and
   the four sets of display data are red display data, green display data, blue display data and white display data, respectively.

7. The method of operating the data drive circuit of the AMOLED display device according to claim 6, wherein the display panel is a four color display panel, comprising red, green, blue and white sub pixels, and in response to the first state of the output control signal, the input output buffer unit provides the red data signal voltage, the green data signal voltage, the blue data signal voltage and the white data signal voltage to the red, green, blue and white sub pixels, respectively.

8. The method of operating the data drive circuit of the AMOLED display device according to claim 6, wherein the display panel is a three color display panel, comprising red, green and blue sub pixels, and in response to the second state of the output control signal, the input output buffer unit provides the red data signal voltage, the green data signal voltage and the blue data signal voltage to the red, green and blue sub pixels, respectively.

9. A method of operating a data drive circuit of an AMOLED display device, comprising:
supplying four sets of display data and supplying four sets of gamma reference voltages;
generating four sets of data signal voltages corresponding to the four sets of display data, respectively, according to the four sets of gamma reference voltages, and supplying the four sets of data signal voltages to an input output buffer unit to which a display panel is electrically coupled;
supplying an output control signal exhibiting two different states, including a first state or a second state different from the first state, to the input output buffer unit, such that the input output buffer unit provides all of the four sets of data signal voltages to the display panel in response to the first state of the output control signal and the input output buffer unit provides three sets in the four sets of data signal voltages to the display panel in response to the second state of the output control signal;
wherein a level shift unit, a latch unit electrically coupled to the level shift unit, a shift register unit electrically coupled to the latch unit, and a data receiving unit electrically coupled to the latch unit;
wherein the four sets of display data are respectively corresponding to the four sets of gamma reference voltages and are supplied to the data receiving unit to be further transmitted from the data receiving unit toward the display panel;
wherein a sensing data process unit is electrically coupled to the input output buffer unit;
wherein the input output buffer unit further receives a sensing voltage signal outputted from the display panel, and transmits the sensing voltage signal to the sensing data process unit, such that an operation of adjustment of the four sets of display data is carried out according to the sensing voltage signal to perform brightness compensation to the display panel; and
wherein the four sets of gamma reference voltages are a red gamma reference voltage, a green gamma reference voltage, a blue gamma reference voltage and a white gamma reference voltage, respectively;
the four sets of data signal voltages are a red data signal voltage, a green data signal voltage, a blue data signal voltage and a white data signal voltage, respectively; and
the four sets of display data are red display data, green display data, blue display data and white display data, respectively.

10. The method of operating the data drive circuit of the AMOLED display device according to claim 9, wherein the input output buffer unit comprises a plurality of input output terminals, and the display panel comprises sub pixel driving circuits that are arranged in an array having columns respectively corresponding to the input output terminals of the input output buffer unit;
wherein each of the input output terminals is electrically coupled to the sub pixel driving circuits of the column of the array corresponding thereto.

11. The method of operating the data drive circuit of the AMOLED display device according to claim 10, wherein each of the sub pixel driving circuits comprises: a first thin film transistor, a second thin film transistor, a third thin film transistor and an organic light emitting diode;
wherein the first thin film transistor comprises a gate that receives a scan pulse signal, a source that is electrically coupled to the input output terminal corresponding to the column of the array in which the sub pixel driving circuit is arranged, and a drain that is electrically coupled to a gate of the second thin film transistor;
wherein the second thin film transistor comprises a gate that is electrically coupled to a direct current high voltage and a drain that is electrically coupled to an anode of the organic light emitting diode;
wherein the third thin film transistor comprises a gate that receives a sensing pulse signal, a source that is electrically coupled to the input output terminal corresponding to the column of the array in which the sub pixel driving circuit is arranged, and a drain that is electrically coupled to a cathode of the organic light emitting diode; and
the cathode of the organic light emitting diode is electrically coupled to a direct current low voltage.

12. The method of operating the data drive circuit of the AMOLED display device according to claim 9, wherein the display panel is a four color display panel, comprising red, green, blue and white sub pixels, and in response to the first state of the output control signal, the input output buffer unit provides the red data signal voltage, the green data signal voltage, the blue data signal voltage and the white data signal voltage to the red, green, blue and white sub pixels, respectively.

13. The method of operating the data drive circuit of the AMOLED display device according to claim 9, wherein the display panel is a three color display panel, comprising red, green and blue sub pixels, and in response to the second state of the output control signal, the input output buffer unit provides the red data signal voltage, the green data signal voltage and the blue data signal voltage to the red, green and blue sub pixels, respectively.

* * * * *